(12) United States Patent
Kikuchi et al.

(10) Patent No.: US 12,610,583 B2
(45) Date of Patent: Apr. 21, 2026

(54) METHOD FOR MANUFACTURING SEMICONDUCTOR DEVICE

(71) Applicant: KIOXIA CORPORATION, Tokyo (JP)

(72) Inventors: Takuya Kikuchi, Yokkaichi Mie (JP);
Yuya Nagata, Nagoya Aichi (JP);
Masaya Toda, Yokkaichi Mie (JP);
Kappei Imamura, Kuwana Mie (JP);
Tsubasa Imamura, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 850 days.

(21) Appl. No.: 17/898,224

(22) Filed: Aug. 29, 2022

(65) Prior Publication Data

US 2023/0307520 A1 Sep. 28, 2023

(30) Foreign Application Priority Data

Mar. 23, 2022 (JP) ................................. 2022-047602

(51) Int. Cl.
*H10D 30/67* (2025.01)
*H10D 86/40* (2025.01)
(Continued)

(52) U.S. Cl.
CPC ....... *H10D 30/673* (2025.01); *H10D 30/6755* (2025.01); *H10D 86/423* (2025.01); *H10D 86/60* (2025.01); *H10D 99/00* (2025.01)

(58) Field of Classification Search
CPC .......... H10D 30/6755; H10D 30/6728; H10D 30/6735; H10D 86/423; H10D 99/00
See application file for complete search history.

(56) References Cited

U.S. PATENT DOCUMENTS 8,551,810 B2 10/2013 Yamazaki
10,644,163 B2 5/2020 Yano et al.
(Continued)

FOREIGN PATENT DOCUMENTS

JP S63264816 A 11/1988
JP H01253715 A 10/1989
(Continued)

OTHER PUBLICATIONS

Zheng Fan et al., "Hydrogen plasma exposure of In/ITO bilayers as an effective way for dispersing In nanoparticles", Nov. 17, 2016, pp. 1-16, Researchgate.net. Retrieved from: https://www.researchgate.net/publication/310463011_Hydrogen_plasma_exposure_of_InITO_bilayers_as_an_effective_way_for_dispersing_In_nanoparticles.

*Primary Examiner* — Vincent Wall
(74) *Attorney, Agent, or Firm* — Kim & Stewart LLP

(57) ABSTRACT

According to one embodiment, a method for manufacturing a semiconductor device includes forming an electrode layer on a film containing indium and etching portions of the electrode layer left exposed by a mask layer until at least a portion of the film is exposed. A spacer film is formed to cover an upper surface of the electrode layer, side surfaces of the electrode layer, and an exposed upper surface of the film. The spacer film on the upper surface of the electrode layer and the exposed upper surface of the film is removed while leaving the spacer film on the side surfaces of the electrode layer. The exposed upper surface of the film is exposed to a reductive gas plasma to reduce portions of the film. These reduced portions of the film are then etched with a chemical solution.

20 Claims, 8 Drawing Sheets

(51) Int. Cl.
    *H10D 86/60*     (2025.01)
    *H10D 99/00*     (2025.01)

(56)            References Cited

U.S. PATENT DOCUMENTS

| | | | |
|---|---|---|---|
| 2012/0181573 | A1 | 7/2012 | Zaban et al. |
| 2019/0067437 | A1* | 2/2019 | Ramaswamy ..... H10D 30/6756 |
| 2019/0296155 | A1* | 9/2019 | Sawabe .................. H10B 12/31 |
| 2020/0303554 | A1* | 9/2020 | Sawabe .................. H10B 63/34 |
| 2021/0249540 | A1 | 8/2021 | Hattori |
| 2021/0375990 | A1* | 12/2021 | Young ............... H10D 30/6728 |
| 2022/0037589 | A1 | 2/2022 | Lee |
| 2022/0059424 | A1 | 2/2022 | Hashigami |
| 2022/0068925 | A1* | 3/2022 | Kawai .................... H10D 99/00 |
| 2022/0085182 | A1* | 3/2022 | Kataoka ............... H10D 64/517 |
| 2022/0285350 | A1 | 9/2022 | Okajima |
| 2023/0307520 | A1* | 9/2023 | Kikuchi ................. H10D 99/00 |
| 2023/0413530 | A1* | 12/2023 | Gawase ................. H10B 12/05 |
| 2023/0422484 | A1* | 12/2023 | Kikuchi ............. H10D 30/6728 |

FOREIGN PATENT DOCUMENTS

| | | | |
|---|---|---|---|
| JP | H10301127 | A | 11/1998 |
| JP | 2014229638 | A | 12/2014 |
| TW | 202035772 | A | 10/2020 |
| TW | 202036846 | A | 10/2020 |
| TW | 202127673 | A | 7/2021 |
| TW | 202131457 | A | 8/2021 |
| TW | 202205707 | A | 2/2022 |

* cited by examiner

METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-047602, filed Mar. 23, 2022, the entire contents of which are incorporated herein by reference.

FIELD

Embodiments described herein relate generally to a method for manufacturing a semiconductor device.

BACKGROUND

When a compound film such as an oxide film containing indium (In) is subjected to dry etching, wet etching, or the like, there can be problems such as a processing residue being generated, a nonvolatile product being attached to the inside of a processing chamber, or the film being generally difficult to process.

BRIEF DESCRIPTION OF THE DRAWINGS

FIGS. 1A to 1C are views illustrating a processing of a compound film containing indium according to a first embodiment.

FIGS. 7A and 7B are cross-sectional views illustrating a second example of aspects related to a step of manufacturing a semiconductor device in a second embodiment.

DETAILED DESCRIPTION

Figure 2:
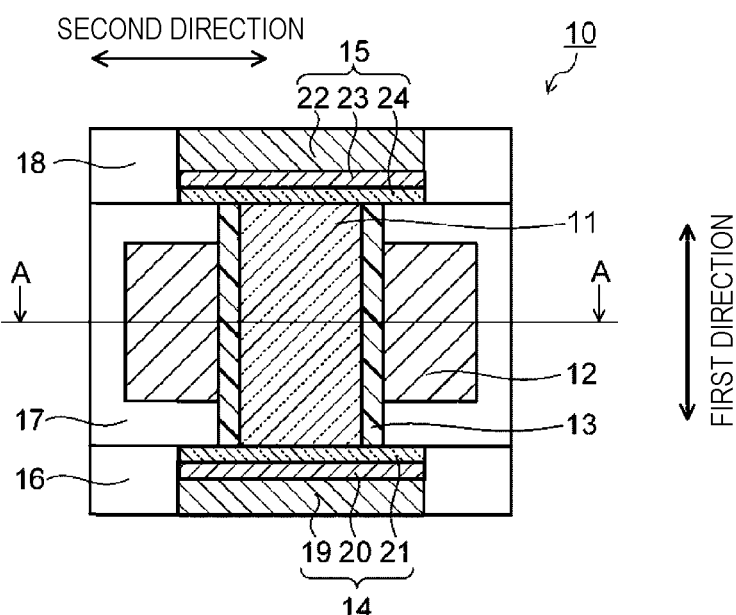
FIG. 2 is a cross-sectional view illustrating a semiconductor device manufactured using a method according to a second embodiment.

Embodiments provide a method for manufacturing a semiconductor device. The method enhances the processability of a compound film containing indium.

In general, according to one embodiment, a method for manufacturing a semiconductor device includes forming an electrode layer on a film containing indium and etching portions of the electrode layer left exposed by a mask layer until at least a portion of the film is exposed. A spacer film can be formed to cover an upper surface of the electrode layer, side surfaces of the electrode layer, and an exposed upper surface of the film. The spacer film on the upper surface of the electrode layer and the exposed upper surface of the film can then be removed while leaving the spacer film on the side surfaces of the electrode layer. The exposed upper surface of the film is exposed to a reductive gas plasma to reduce portions of the film. These reduced portions of the film are then etched with a chemical solution.

Hereinafter, a method for processing a compound film and a method for manufacturing a semiconductor device in embodiments will be described with reference to the drawings. In each embodiment, substantially the same components are denoted with the same reference numerals and description thereof will be partially omitted. The drawings are schematic, and relationships between thickness and plane size, ratios of thicknesses of portions, and the like may be different from those of an actual thing.

First Embodiment

Figures 1A, 1B, 1C:
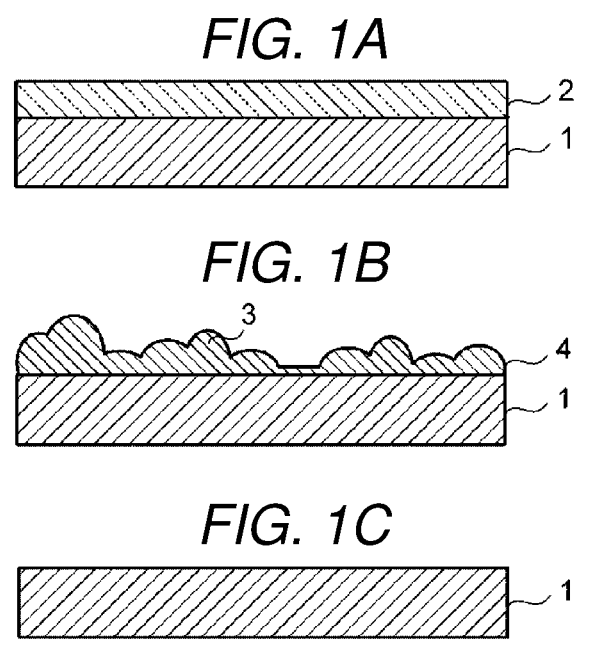

FIGS. 1A to 1C show a step of processing a film containing indium (In). As shown in FIG. 1A, a compound film 2 containing In (an indium compound film) is formed on a substrate 1 by, for example, physical vaper deposition (PVD). The substrate 1 can be appropriately selected according to the end use application of the compound film 2. For example, a semiconductor substrate, a conductive substrate (such as a metal substrate), an insulating substrate (such as a ceramics substrate), or the like can be used. These substrates may be used as the substrate 1 as they are. Alternatively, a substrate having a functional layer such as a conductive layer, an insulating layer, and/or a semiconductor layer thereon may be used as the substrate 1. The compound film 2 may be formed on such a functional layer of the substrate 1.

Examples of a compound containing indium that might form the compound film 2 include a compound of indium with a nonmetal element or a metalloid element among periodic group 15 elements, periodic group 16 elements, and periodic group 17 elements, for example, oxygen (O), phosphorus (P), boron (B), carbon (C), nitrogen (N), silicon (Si), sulfur (S), selenium (Se), tellurium (Te), fluorine (F), chlorine (Cl), bromine (Br), and iodine (I). Specific examples of such a compound include indium oxide (InO), indium phosphide (InP), indium nitride (InN), indium arsenide (InAs), and indium selenide (InSe). The compound may be a mixture of such compounds. It is noted that a compound containing In may also contain a metal element other than In, for example, tin (Sn), gallium (Ga), aluminum (Al), or zinc (Zn).

A compound containing In, such as indium oxide and indium phosphide, may function as a semiconductor or a conductor. A compound containing In may be an oxide containing In such as indium tin oxide (ITO), indium gallium zinc oxide (In—Ga—Zn oxide: IGZO), indium aluminum zinc oxide (In—Al—Zn oxide: IAZO), or indium oxide (InO).

An oxide containing In that has a large ratio of indium oxide, such as ITO, has disadvantages related to resistance of such a material to an acidic or alkaline chemical solution that is used in wet etching or the like being high. Such materials may also leave a processing residue or a nonvolatile product when exposed to, or processed with, a halogen-containing gas (HBr, $Cl_2$, etc.) or an organic gas ($CH_4$, $CH_3OH$, $CF_4$, $CHF_3$, etc.), such as might be used in dry etching or the like. Thus, an oxide containing In is difficult to efficiently etch without generating a processing residue.

As a countermeasure for this, a processing method such as an etching method of an embodiment of the present disclosure can be adopted. In general, when an oxide containing In is in a crystalline state, processing is considered difficult. Therefore, when a compound is to be processed, such as an oxide containing In, and also contains a crystalline portion, the processing method according to an embodiment may be particularly effective.

After the initial processing of the compound film 2 is subjected to a reduction treatment with a plasma of a reductive gas. Examples of a reductive gas used in the plasma treatment include a gas containing a hydrogen atom (H), for example, a gas containing at least one compound selected from hydrogen ($H_2$), ammonia ($NH_3$), hydrogen sulfide ($H_2S$), and water vapor ($H_2O$) can be used. Mixtures of such gases may be adopted in the reduction treatment of the compound film 2. In addition, hydrogen fluoride (HF), hydrochloric acid (HCl), hydrogen bromide (HBr), hydrogen iodide (HI), methane ($CH_4$), trifluoromethane ($CHF_3$), difluoromethane ($CH_2F_2$), fluoromethane ($CH_3F$), or the like may be used in some examples.

In the treatment with the reductive gas plasma, the substrate 1 including the compound film 2 thereon is placed in a chamber of a plasma treatment device. The reductive gas is introduced into the chamber, and a high-frequency voltage is applied to an electrode disposed in the chamber to generate a plasma. Thus, the compound film 2 is treated with the plasma of the reductive gas. The compound film 2 is exposed to the plasma of the reductive gas in the treatment or processing. When this occurs, the compound film 2 can be reduced to produce indium residue or nanoparticles 3 of In and metal (Sn or the like) (which may be referred to as "metal nanoparticles containing In"), as shown in FIG. 1B. The compound film 2 containing In can be modified into a metal film 4 in which the metal nanoparticles 3 are deposited. Such a metal film 4 containing In has better processability than an oxide film containing In. Thus, the metal film 4 containing In can be more efficiently be treated with, for example, a chemical solution such as an etchant and the occurrence of a processing residue can be prevented.

When metal film 4 is treated with a chemical solution, the chemical solution used may be, for example, an acidic liquid such as an aqueous solution of about 0.5% to 40% by mass hydrochloric acid (HCl), an aqueous solution of about 0.01% to 50% by mass hydrofluoric acid (HF), a mixed liquid of at least 30% by mass hydrochloric acid (HCl) with not more than 70% by mass nitric acid ($HNO_3$), or a mixed solution obtained by diluting such a mixed liquid with water ($H_2O$) at any ratio of 10% by volume or more can generally be used.

When metal film 4 is treated with the acidic liquid, the metal film 4 containing In can be etched and removed as shown in FIG. 1C.

The compound film 2 including the crystallized oxide containing In or the like would be etched along grain boundaries by an acidic liquid of this type. In such a case, a granular residue may be easily generated, but the metal nanoparticles 3 of the metal film 4 formed by reductive plasma treatment of the compound film 2 are more easily and completely etched away with the acidic liquid or the like. Accordingly, the metal film 4 containing In can be etched and removed without generating a processing residue. As a chemical solution for processing, an alkaline solution or the like may be used according to the composition of the metal film 4. The chemical solution used in the treatment shown in FIG. 1C can be appropriately selected according to the kind of the treatment to be performed and the expected composition of the metal film 4.

Second Embodiment

Figure 3:
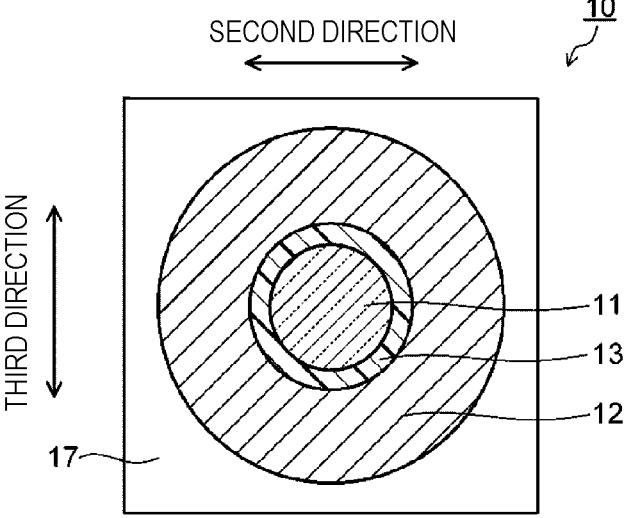
FIG. 3 is a cross-sectional view taken along line A-A in FIG. 2.
Figures 4A, 4B:
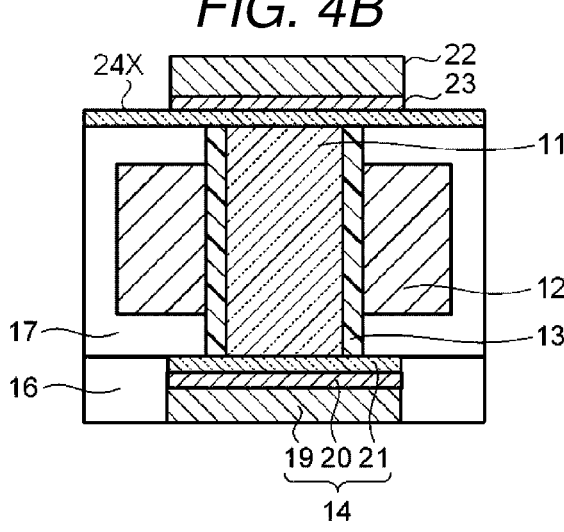
FIGS. 4A and 4B are cross-sectional views illustrating a first example of aspects related to a step of manufacturing a semiconductor device in a second embodiment.

FIG. 2 is a cross-sectional view of a semiconductor device in a second embodiment. FIG. 3 is a cross-sectional view taken along line A-A in FIG. 2. In FIGS. 4A and 4B, a vertical direction is a first direction, and two directions orthogonal to the first direction are a second direction and a third direction.

A semiconductor device 10 shown in FIGS. 2 and 3 is a transistor in which an oxide semiconductor material is used as a channel layer. The transistor 10 is a vertical transistor, or a so-called surrounding gate transistor (SGT), in which a gate electrode surrounds the channel layer.

The transistor 10 includes a channel layer 11 formed from an oxide semiconductor, a gate electrode 12, a gate insulating layer 13, a source electrode 14, a drain electrode 15, a first interlayer insulating layer 16, a second interlayer insulating layer 17, and a third interlayer insulating layer 18. The channel layer 11 contains, for example, at least one element selected from the group consisting of indium (In), gallium (Ga), silicon (Si), aluminum (Al), and tin (Sn), zinc (Zn), and oxygen (O). In one example, channel layer 11 comprises indium (In), gallium (Ga), and zinc (Zn). In another example, channel layer 11 comprises indium (In), aluminum (Al), and zinc (Zn). The source electrode 14 has a first electrode layer 19, a first barrier layer 20, and a first oxide conductor layer 21. The drain electrode 15 has a second electrode layer 22, a second barrier layer 23, and a second oxide conductor layer 24.

For the electrode layer 19 in the source electrode 14 and the electrode layer 22 in the drain electrode 15, tungsten (W), a tungsten alloy, molybdenum (Mo), a molybdenum alloy, or the like is used. For the barrier layers 20 and 23, titanium nitride (TiN), tantalum nitride (TaN), or the like is used. The oxide conductor layer 21 is disposed between the channel layer 11 and the electrode layer 19, the oxide conductor layer 24 is disposed between the channel layer 11 and the electrode layer 22, the barrier layer 20 is disposed between the oxide conductor layer 21 and the electrode layer 19, and the barrier layer 23 is disposed between the oxide conductor layer 24 and the electrode layer 22. The oxide conductor layers 21 and 24 are formed from, for example, of the same material. The first oxide conductor layer 21 and the second oxide conductor layer 24 are, for example, an oxide-based conductor containing indium (In), tin (Sn), and oxygen (O). The first oxide conductor layer 21 and the second oxide conductor layer 24 are, for example, indium tin oxide ("ITO").

The channel layer 11 is provided between the source electrode 14 and the drain electrode 15. In the channel layer 11, a channel providing a current route is formed during the on-operation of the transistor 10. The channel layer 11 has a cylinder shape extending in the first direction. The width in the second direction of the channel layer 11 is, for example, 20 nm or more and 50 nm or less. The gate length (the width in the first direction) of the gate electrode 12 is, for example, 20 nm or more and 100 nm or less. The gate electrode 12 surrounds the channel layer 11. The gate electrode 12 is provided around the channel layer 11 via the gate insulating layer 13.

The gate insulating layer 13 is provided between the channel layer 11 and the gate electrode 12. The gate insulating layer 13 surrounds the channel layer 11. The gate insulating layer 13 is formed from, for example, an oxide or an oxynitride. The gate insulating layer 13 is formed from, for example, silicon oxide, silicon nitride, or aluminum oxide. The thickness of the gate insulating layer 13 is, for example, in a range of 2 nm to 10 nm.

For example, the interlayer insulating layers 16, 17, and 18 are provided between the source electrode 14 and the gate electrode 12, between the drain electrode 15 and the gate electrode 12, and around the gate electrode 12. The interlayer insulating layers 16, 17, and 18 electrically separate the source electrode 14, the drain electrode 15, and the gate electrode 12. The interlayer insulating layers 16, 17, and 18 are formed from, for example, an oxide. The interlayer insulating layers 16, 17, and 18 are, for example, silicon oxide.

A process of manufacturing the oxide semiconductor transistor 10 will be described with reference to FIGS. 4A to 5B. As shown in FIG. 4A, a structure 25 including the source electrode 14, the channel layer 11, the gate insulating layer 13, and the gate electrode 12 is formed in accordance with a known method for manufacturing a surrounding gate transistor (SGT). An ITO film 24X (to become the second oxide conductor layer 24) is formed on the structure 25 so as to come into contact with the channel layer 11, a TiN film 23X (to become the second barrier layer 23) is formed, and a tungsten film 22X (to become the second electrode layer 22) is then formed.

Next, the TiN film 23X and the tungsten film 22X are etched by a dry etching process, such as reactive ion etching (RIE), to form the barrier layer 23 and the electrode layer 22, respectively, as shown in FIG. 4B. The barrier layer 23 and the electrode layer 22 can then be used as a mask so a portion of the ITO film 24X that is exposed by the mask can be selectively exposed to a plasma of a reductive gas, such as $H_2$, $NH_3$, $H_2S$, or $H_2O$, in the same manner as in the step shown in FIG. 1B. As a result, the exposed portion of the ITO film 24X is converted to a modified film 24Y in which In-Sn nanoparticles are deposited as shown in FIG. 5A.

The now-modified portion of the ITO film 24X (that is, the modified film 24Y) is then treated with an acidic chemical solution, such as a 20% HCl aqueous solution. As a result, the modified film 24Y is etched and removed as shown in FIG. 5B. Thus, the second oxide conductor layer 24 that has a desired shape and is in contact with the channel layer 11 is obtained. When the exposed portion of the ITO film 24X is subjected to a combined treatment of a reduction treatment with a plasma of $H_2$ (or the like) and wet etching, the unwanted portions of the ITO film 24X can be etched without generating a processing residue. Therefore, the transistor 10 can be processed into a desired shape without adverse effects related to generation of processing residues or the like. If the ITO film 24X were to be treated only by a dry etching process, problems such as bowing of the mask and attachment of indium dust or the like to the chamber of the treatment device might arise. This is because RIE for etching ITO generally requires a high energy. On the other hand, the treatment of ITO according to the embodiment can prevent the occurrence of these problems.

Figures 5A, 5B:
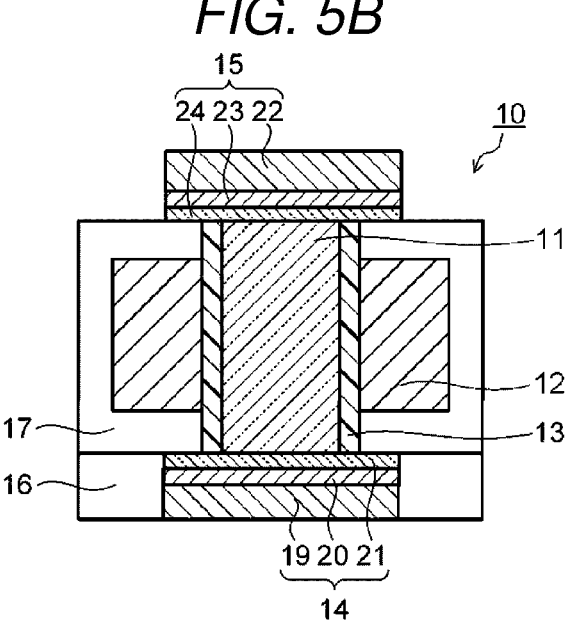
FIGS. 5A and 5B are cross-sectional views illustrating additional aspects related to a step of manufacturing a semiconductor device in a second embodiment.
Figure 6:
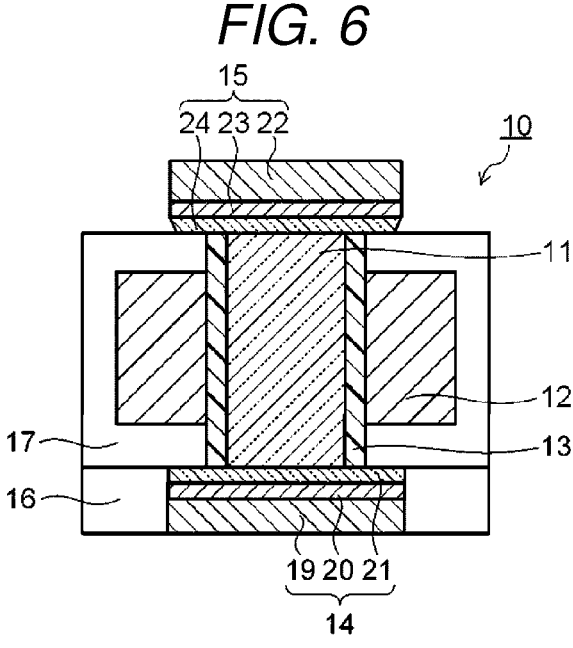
FIG. 6 is a cross-sectional view illustrating a modification of a semiconductor device shown in FIGS. 5A and 5B.

By the etching process described for FIG. 5B, the cross-sectional area of the second oxide conductor layer 24 might be expected to result in being made smaller than the cross-sectional area of the second barrier layer 23 or the second electrode layer 22, such as shown in FIG. 6.

Figures 7A, 7B:
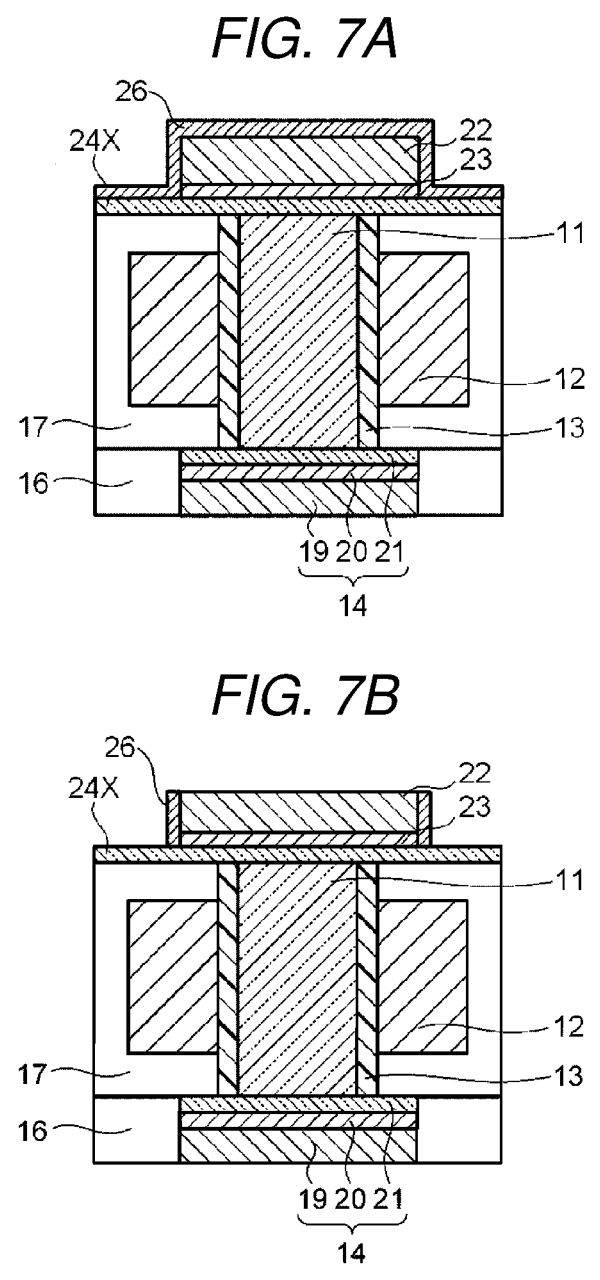

In particular, when the reduction treatment with the plasma of the reductive gas is followed by wet etching, as described above with respect to FIG. 1C, some sideways etching may occur into the ITO film 24X. This side etching of the ITO film 24X refers to a state in which the length of the ITO film 24X in the second or third direction becomes shorter than the length of the TiN film 23X and the W film 22X in the second or third direction. To cope with or mitigate such side etching, the formation of a spacer film 26 on a side surface of a stacked film including the second barrier layer 23 and the second electrode layer 22, as shown in FIGS. 7A and 7B, can be effective. Incorporation of the spacer film 26 makes it possible to provide a margin corresponding to the thickness of the spacer film 26 to account for the possible side etching of the ITO film 24X, and thus the ITO film 24X can be processed to more closely match the edge positions of the second barrier layer 23 and the second electrode layer 22 even with some sideways etching of the ITO film 24X during the removal of the modified film 24Y.

In this example, the spacer film 26 is initially formed so as to cover the side surface and the upper surface of the stacked film including the second barrier layer 23 and the second electrode layer 22 as well as the exposed upper surface of the ITO film 24X that is left exposed by the stacked film, as shown in FIG. 7A. For example, a silicon oxide, a silicon nitride, or an organic substance is used for the spacer film 26. The thickness of the spacer film 26 is preferably equal to or greater than the thickness of the ITO film 24X. Subsequently, the spacer film 26 on the upper surfaces of the second electrode layer 22 and the ITO film 24X can be etched and removed so as to leave just the spacer film 26 on the side surface of the stacked film (including the second barrier layer 23 and the second electrode layer 22) as shown in FIG. 7B.

Figure 8A:
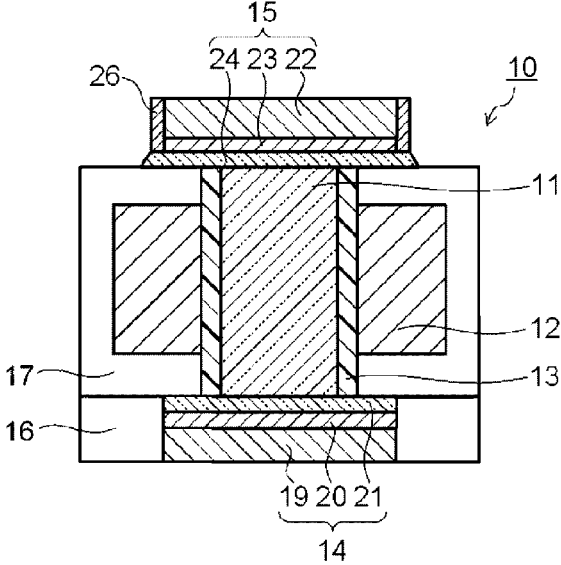
FIGS. 8A and 8B are cross-sectional views illustrating additional aspects related to a step of manufacturing a semiconductor device in a second embodiment.
Figure 8B:
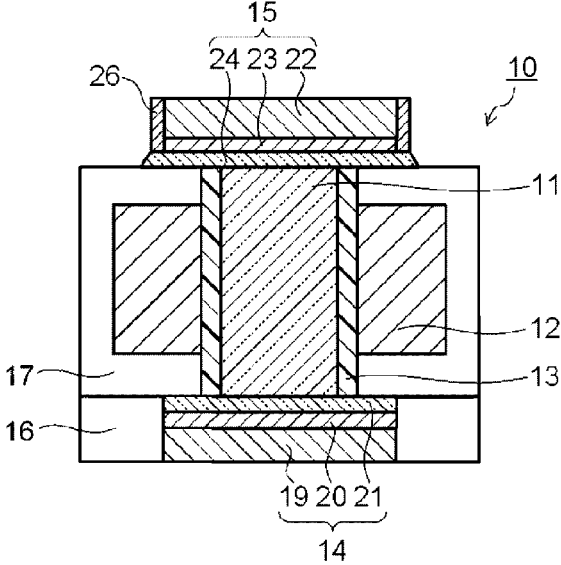

The now-exposed portion of the ITO film 24X is then exposed to a plasma of a reductive gas in the same manner as in the step shown in FIG. 5B, and as a result, the portion of the ITO film 24X that is exposed is converted to the modified film 24Y in which In—Sn nanoparticles are deposited as shown in FIG. 8A. The modified film 24Y is then treated with an acidic liquid, such as a 20% HCl aqueous solution, and the modified film 24Y is etched and removed as shown in FIG. 8B. Thus, an oxide conductor layer 24 that has a desired shape can be obtained.

In the plasma treatment step shown in FIG. 8A and the etching step shown in FIG. 8B, some portion of the margin provided by the thickness of the spacer film 26 can be left afterwards, and thus excessive side etching of the ITO film 24X can be prevented.

The spacer film 26 on the side surface of the stacked film can be used as a sidewall for the transistor 10 in accordance with the manufacturing steps shown in FIGS. 7A to 8B. In this case, the sidewall may be formed on the side surface of the second barrier layer 23 and the second electrode layer 22 after exposure of the ITO film 24X to the plasma of the reductive gas instead of before exposure of the ITO film 24X to the plasma of the reductive gas as shown in FIGS. 7A and 7B. When a plasma of $NH_3$ is used in the plasma treatment of the ITO film 24X, the side surface of the stacked film can be treated by exposure to the plasma of $NH_3$ in addition to conversion of the ITO film 24X to the modified film 24Y.

The side surface of the second electrode layer 22 comprising a tungsten film or the like can be treated with the plasma of $NH_3$ to form a nitride of tungsten (WN) (tungsten nitride) on the side surface of the tungsten film. When a silicon nitride (SiN) is used as the sidewall, tungsten nitride (WN) formed on the side surface of the tungsten film may function to improve adherence of the silicon nitride (SiN). Therefore, the adherence of the sidewall formed on the side surface of the second electrode layer 22 can be improved, and the quality of the transistor 10 can be enhanced.

Figure 9:
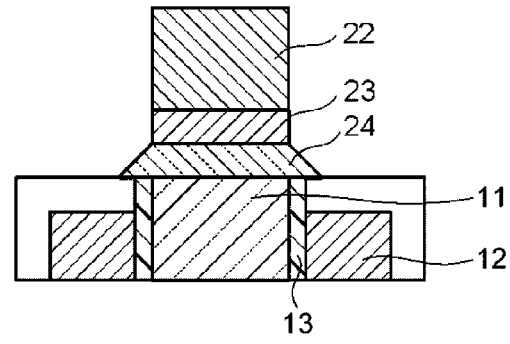
FIG. 9 is a partial cross-sectional view illustrating a modification of a semiconductor device in a second embodiment.

The interface surface of the second oxide conductor layer 24 and the channel layer 11 may be made larger than the interface surface of the second oxide conductor layer 24 and the second barrier layer 23 by sloping an end of the second oxide conductor layer 24 as shown in FIG. 9. That is, the lower surface of the second oxide conductor layer 24 may be larger in area than the upper surface of the second oxide conductor layer 24. Such a shape facilitates electric connection of the drain electrode 15 to the channel layer 11. It is generally desirable that the lower surface of the second oxide conductor layer 24 be larger than the upper surface of the channel layer 11. Instead of the slope at the end of the second oxide conductor layer 24, the cross-sectional shape of the second oxide conductor layer 24 may have a shape in which the width of a lower end is larger than the width of an upper end (two-step shape). In formation of a second oxide conductor layer 24 that has such a shape, the combined treatment of the reductive plasma treatment and wet etching as described above can be effectively adopted for the second oxide conductor layer 24.

Figure 10A:
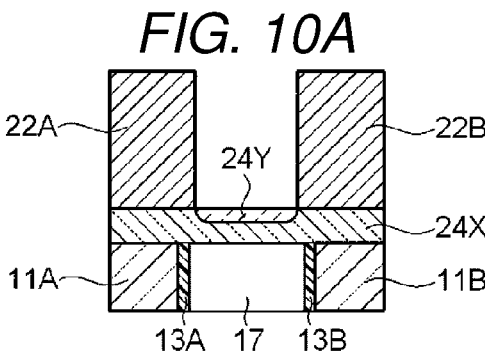
FIGS. 10A to 10D are cross-sectional views illustrating a third example of aspects related to a step of manufacturing a semiconductor device in a second embodiment.

A forming of the oxide conductor layer 24 having a two-step shape will be described with reference to FIGS. 10A to 10D. FIGS. 10A to 10D show a processing state of the oxide conductor layer 24 (the ITO film 24X) present between adjacent channel layers 11A and 11B and adjacent electrode layers 22A and 22B. The exposed portion of the ITO film 24X is first treated with a plasma of a reductive gas, and as a result, the portion of the ITO film 24X that is exposed from the mask is converted to the modified film 24Y as shown in FIG. 10A. In this case, when conditions of the treatment with the plasma of the reductive gas are appropriately controlled, a region of the modified film 24Y is made thinner than the thickness of the ITO film 24X.

Figure 10B:
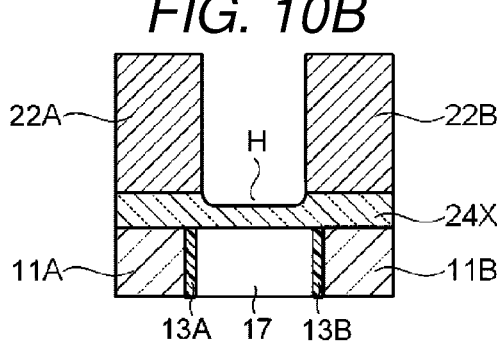
Figure 10C:
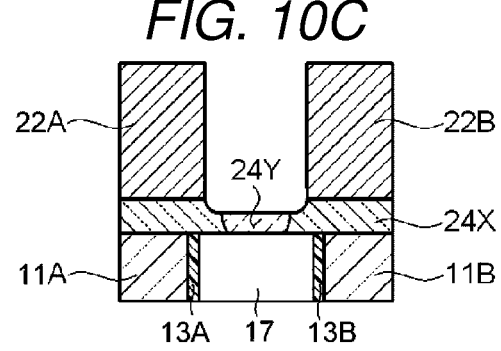

Subsequently, the region of the modified film 24Y is etched with an acidic liquid such as a 20% HCl aqueous solution as shown in FIG. 10B. For this process, the region of the modified film 24Y is set to be thinner than the thickness of the ITO film 24X, and thus only the portion of the ITO film 24X in the thickness direction is etched to form a thin concave H. The portion of the ITO film 24X that remains after the etching step shown in FIG. 10B is then treated with a plasma of a reductive gas, and as a result, the remaining portion of the ITO film 24X is at least partially converted to the modified film 24Y as shown in FIG. 10C. In this case, the width of the modified region (a region formed of the modified film 24Y) treated with the plasma is kept smaller than the width between the adjacent channel layers 11A and 11B by the formation of a mask or the like.

Figure 10D:
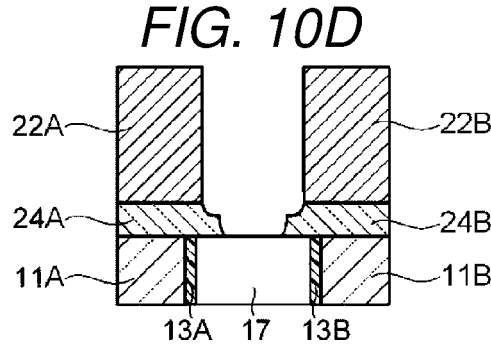

Subsequently, the modified region (the region formed at the modified film 24Y) is etched with an acidic liquid such as a 20% HCl aqueous solution as shown in FIG. 10D. By such a plasma treatment and etching in two stages, the second oxide conductor layer 24 having a cross-sectional shape in which the width of the lower end is less than the width of the upper end (two-step shape) can be obtained. Therefore, even when a position is deviated, the channel layer 11 can still be easily electrically connected to the second oxide conductor layer 24. In some examples, the spacer film 26 may be formed before the treatment of FIG. 10A or the plasma treatment of FIG. 10C.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, the method comprising:

forming an electrode layer on a film containing indium; etching portions of the electrode layer left exposed by a mask layer until at least a portion of the film is exposed;

forming a spacer film so as to cover an upper surface of the electrode layer, side surfaces of the electrode layer, and an exposed upper surface of the film;

removing the spacer film on the upper surface of the electrode layer and the exposed upper surface of the film while leaving the spacer film on the side surfaces of the electrode layer;

exposing the exposed upper surface of the film to a reductive gas plasma to reduce portions of the film; and etching the reduced portions of the film with a chemical solution.

2. The method according to claim 1, wherein the reductive gas plasma is formed from at least one of $H_2$, $NH_3$, $H_2S$, and $H_2O$.

3. The method according to claim 1, wherein the film is an oxide-based conductor material.

4. The method according to claim 1, wherein the film comprises an indium compound formed with at least one element this is a nonmetal element or a metalloid element selected from among Group 15 elements, Group 16 elements, and Group 17 elements.

5. The method according to claim 1, wherein the film additionally contains at least one of oxygen, phosphorus, boron, carbon, nitrogen, silicon, sulfur, selenium, tellurium, fluorine, chlorine, bromine, and iodine.

6. The method according to claim 1, wherein the film comprises at least one of indium tin oxide, indium gallium zinc oxide, indium oxide, and indium aluminum zinc oxide.

7. The method according to claim 6, wherein the film additionally contains at least one of oxygen, phosphorus, boron, carbon, nitrogen, silicon, sulfur, selenium, tellurium, fluorine, chlorine, bromine, and iodine.

8. The method according to claim 6, wherein the film has a crystallized portion.

9. The method according to claim 1, wherein the film has a crystallized portion.

10. The method according to claim 1, wherein the chemical solution is acidic.

11. The method according to claim 1, wherein the reductive gas plasma converts the exposed portions of the film to a substantially metallic material.

12. The method according to claim 11, wherein the substantially metallic material comprises nanoparticles including indium.

13. The method according to claim 1, wherein the film is an indium tin oxide film.

14. The method according to claim 1, wherein the film contacts a channel layer and a gate insulating layer of a surrounding gate transistor.

15. A method of making a surrounding gate transistor, the method comprising:

forming a stacked body including a first electrode, a channel layer on the first electrode, a gate insulating film surrounding the channel layer, a gate electrode surrounding the gate insulating film, and interlayer insulating film surrounding the gate electrode;

forming an indium tin oxide (ITO)-based film on an upper
surface of the stacked body, the ITO-based film con-
tacting the interlayer insulating film, the gate insulating
film, and the channel layer;

forming a barrier layer metal film on the ITO-based film;

forming a conductor layer film on the barrier metal film;

etching portions of the conductor layer film and the
barrier metal film to form a second electrode at a
position above the channel layer, the etching exposing
a portion of the ITO-based film;

exposing the exposed portion of the ITO-based film to a
reductive gas plasma to convert the exposed portion of
the ITO-based film to an indium-containing metal film;
and etching the indium-containing metal film to expose an
upper surface of the interlayer insulating film.

16. The method according to claim 15, further compris-
ing:

forming a spacer film after etching the portions of the
conductor layer film and the barrier metal film; and removing portions of the spacer film from upper surfaces
of the conductor film and the exposed portion of the
ITO-based film.

17. The method according to claim 15, wherein the
etching of the indium-containing metal film is performed
using an acidic liquid.

18. A method for manufacturing a semiconductor device,
the method comprising:

forming an electrode layer on a film containing indium;

patterning the electrode layer by selectively etching the
electrode layer, the etching exposing a portion of the
film;

performing a reduction treatment on the exposed portion
of the film and the electrode layer with a plasma of a
reductive gas, the reduction treatment converting the
exposed portion of the film to a metallic film including
indium;

forming a spacer film so as to cover an upper surface of
the electrode layer, side surfaces of the electrode layer,
and an upper surface of the film;

removing the spacer film from the upper surface of the
electrode layer and the upper surface of the film; and wet etching the metallic film including indium with a
chemical solution.

19. The method according to claim 18, wherein the reduction treatment forms a nitride on the side sur-
faces of the electrode layer, and the spacer film is formed on the nitride.

20. The method according to claim 19, wherein the electrode layer is tungsten, and tungsten nitride is formed on the side surfaces of the
electrode layer by the reduction treatment.

* * * * *